United States Patent [19]

Sill et al.

[11] Patent Number: 4,803,173

[45] Date of Patent: Feb. 7, 1989

[54] METHOD OF FABRICATION OF SEMICONDUCTOR DEVICE HAVING A PLANAR CONFIGURATION

[75] Inventors: Edward L. Sill, San Jose; Paul G. Hilton, Boulder Creek, both of Calif.

[73] Assignee: North American Philips Corporation, Signetics Division, Sunnyvale, Calif.

[21] Appl. No.: 67,032

[22] Filed: Jun. 29, 1987

[51] Int. Cl.⁴ .............................................. H01L 21/22
[52] U.S. Cl. .................................... 437/29; 437/34; 437/41; 437/56; 437/58; 437/203; 437/193; 437/31
[58] Field of Search ................. 437/29, 31, 46, 67, 437/162, 192, 193, 203, 41, 43, 34, 56, 58

[56] References Cited

U.S. PATENT DOCUMENTS

| | | | |
|---|---|---|---|
| 4,222,164 | 9/1980 | Triebwasser | 437/192 X |
| 4,234,362 | 11/1980 | Riseman | 437/192 X |
| 4,359,816 | 11/1982 | Abbas et al. | 437/41 |
| 4,419,810 | 12/1983 | Riseman | 437/41 |
| 4,436,582 | 3/1984 | Saxena | 156/656 |
| 4,601,095 | 7/1986 | Kikuchi et al. | 437/41 |
| 4,641,416 | 2/1987 | Iranmanesh et al. | 437/41 |
| 4,677,736 | 7/1987 | Brown | 437/41 |
| 4,704,784 | 11/1987 | Szyldo | 43/41 |
| 4,713,356 | 12/1987 | Hiruta | 437/193 X |
| 4,727,045 | 2/1988 | Cheung et al. | 437/193 X |

FOREIGN PATENT DOCUMENTS 0105575  6/1983  Japan .......................... 437/41
8607190  12/1986  World Int. Prop. O. .......... 437/203

OTHER PUBLICATIONS

Johnson, "Self-Alignment Technique for Fabricating High-Performance FET's", IBBTDB vol. 15, No. 2, Jul. 1972, pp. 680-681.

Primary Examiner—Brian E. Hearn
Assistant Examiner—Tom Thomas
Attorney, Agent, or Firm—John C. Fox

[57] ABSTRACT

An MOS device having a planar configuration in which the top surfaces of the source, drain and gate electrodes are coplanar, and the overlying electrical contact structure is also planar, is produced by a method of fabrication in which the gate is defined by forming an oxide mesa on a substrate, building up the substrate with semiconductor material around the mesa, removing the mesa, and filling the resultant trough with doped polysilicon to form the self-aligned gate. Line width and alignment control are enchanced. The planarity of the device and the improved dimensional control enable a reduction of device dimensions and consequently increased device density in integrated circuits.

16 Claims, 5 Drawing Sheets

METHOD OF FABRICATION OF SEMICONDUCTOR DEVICE HAVING A PLANAR CONFIGURATION

BACKGROUND OF THE INVENTION

This invention relates to semiconductor devices, and more specifically relates to such devices having a planar configuration, which are particularly suitable for use in high density integrated circuits, and also relates to a method of fabrication of such devices.

As the semiconductor devices in integrated circuits become smaller and more closely packed, the upper layers of the devices, such as the metal interconnect patterns, must accommodate more abrupt changes in surface topography caused by the smaller lateral dimensions of the devices. In some cases, deviations from planarity, sometimes called "steps", cannot be covered completely, so that discontinuities occur in the overlying metal layer. The problem is accentuated as more layers are added, such as in the case of interconnected multi-level integrated circuits, creating more complicated surface topographies having more and larger steps.

Etching techniques are known which will "planarize" a non-planar surface. For example, U.S. Pat. No. 4,025,411 describes a process in which the non-planar surface of a semiconductor device is made planar by first applying a layer of liquid photoresist over the uneven surface, then allowing the photoresist to solidify, and finally etching the surface by a physical etching method (for example, RF sputter etching or ion milling) which removes the photoresist and the underlying material at about the same rate. Other planarization techniques for use with solid state devices are described in U.S. Pat. Nos. 4,073,054; 4,455,193; and 4,470,874.

As device miniaturization approaches the sub-micron level, another problem is encountered, namely line width control, or LWC, that is, the ability to print and etch a line within the required dimensional tolerances. Thus, for example, it becomes difficult in the fabriction of MOS (metal oxide semiconductor) transistors to accurately control the dimensions of a gate electrode having a length of 1 micron or less. Such a gate is typically formed by first depositing a polysilicon layer over an insulating oxide layer, masking the polysilicon layer, and then etching away the unmasked portions of the polysilicon layer to leave a gate electrode of the desired configuration. The materials currently in use for etching polysilicon generally cannot provide the desired LWC due to a tendency both to attack the photoresist and to etch the polysilicon isotropically, resulting in undercutting of the mask.

Still another problem encountered in device miniaturization is mask alignment tolerance. For example, the masks employed in the formation of the polysilicon gate and the overlying contact can generally be aligned with an accuracy of only about + or −0.75 microns. A total misalignment of up to + or −1.50 microns is possible between two levels aligned to a third.

Accordingly, it is a principal object of the invention to provide an MOS device having a planar configuration which will be particularly suitable for use in high density integrated circuits.

It is another object of the invention to provide a fabrication technique for such a planar semiconductor device which has improved line width and alignment control, and which is therefor particularly suitable for the production of sub-micron semiconductor devices.

SUMMARY OF THE INVENTION

In accordance with one aspect of the invention, there is provided an MOS device comprising source, drain and gate electrodes in a body of semiconductor material, which device is characterized in that the top surface of the gate is co-planar with the top surfaces of the source and drain. The body of semiconductor material is made up of a single crystal substrate and a conducting layer, usually a doped polycrystalline layer of the same material, on the surface of the substrate. At least the upper regions of the source and drain are located in the polycrystalline layer and these source and drain regions are separated by a trough in the polycrystalline layer. The gate electrode is located in this trough and is separated from the source and drain regions by insulating layers covering the walls and floor of the trough.

Electrical contact to the source, drain and gate regions is made in the conventional manner by etching holes in an overlying insulating layer above the source, drain and gate electrodes, and filling the holes with an electrical contact material. A metallization pattern is then formed in the conventional manner.

The location of the gate in the trough not only enables the top surface of the gate to be coplanar with the source and drain regions, but also enables improved dimensional control, by the avoidance of separate polysilicon masking and etching steps.

In accordance with a preferred embodiment, the gate and at least the upper regions of the source and drain electrodes all consist of doped polycrystalline semiconductor material, and the upper surfaces of these electrodes are covered with separate layers of a material having a higher electrical conductivity than the doped polycrystalline material.

In accordance with another preferred embodiment, there is included in the device at least one deep isolation channel of insulating material for electrically isolating the device from one or more laterally adjacent devices which are located in the semiconductor body.

In accordance with another aspect of the invention; there is provided a method for fabricating a planar MOS device, the method essentially including the following steps:

(a) selectively removing portions of a thick insulating layer on a single crystal semiconductor substrate to leave a mesa of insulating material on the substrate in a position corresponding to the desired gate region for the device;

(b) depositing a layer of source and drain material on the substrate and over the mesa to build up the surface of the semiconductor body as well as to define a gate trough therein;

(c) removing a portion of the source and drain layer in a manner to planarize the upper surface of the layer and also to expose the mesa;

(d) removing the insulating mesa from the gate trough;

(e) forming an insulating layer on the walls and floor of the gate trough;

(f) filling the gate trough with gate material;

(g) forming source and drain regions in the semiconductor body; and (h) providing electrical connection to the source, drain and gate regions by first forming contacts to the source, drain and gate regions and then forming a metallization pattern for external electrical connection to these contacts.

In accordance with preferred embodiments of the method of fabrication, the source and drain layer and other layers such as the metallization layer are planarized by a technique which involves: depositing a layer of liquid photoresist on the uneven layer to be planarized in order to achieve a planar surface; allowing the photoresist to solidify; and then etching the photoresist and the underlying layer at approximately the same rate so as to remove the photoresist and at least the uneven portion of the underlying surface.

The gate may be formed by: forming a thin insulating layer over the entire exposed surface of the semiconductor body including the gate trough formed as described above; depositing a layer of gate material on this thin insulating layer; and planarizing the layer of gate material by the technique described above until all of the gate material has been removed except that remaining in the trough, so that the top surface of the gate is substantially co-planar with the top surfaces of the adjacent source and drain regions.

Where the source and drain material is a polycrystalline semiconductor material, the source and drain regions may be formed either by implanting dopants through the thin insulating layer into the semiconductor body, or by selectively removing the thin insulating layer from over the source and drain regions and then thermally diffusing the dopants directly into the semiconductor body, both in the known manner.

In still another embodiment of the invention, a slight modification of the method allows the formation of a bipolar device. In this embodiment, the oxide at the bottom of the gate trough is removed, or the bottom of the trough has been masked to prevent oxide formation, and an electrode layer is subsequently deposited directly on the silicon substrate, this would allow the formation of a bipolar device. This electrode layer, such as an appropriately doped polysilicon layer, becomes the emitter in the bipolar device, while the surrounding polysilicon is the base contact. It is also possible to form both MOS and bipolar devices on the same substrate by selective deposition or removal of oxide on the floor of troughs in laterally adjacent devices.

Other embodiments and variations of the invention will become apparent to those skilled in the art from the following detailed description, with accompanying drawings, of a preferred embodiment of the invention.

DESCRIPTION OF THE PREFERRED EMBODIMENTS

Figure 1:
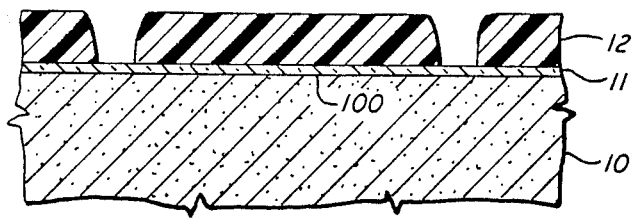
FIGS. 1 through 17 are sectioned elevation views showing the sequential steps involved in the fabrication of an MOS device of the invention.

Referring now to FIG. 1, there is shown a body of single crystal silicon 10, having on its upper surface 100 a relatively thin insulating layer 11 of thermally grown silicon dioxide, ($SiO_2$). On top of this thermally grown oxide layer 11 is a patterned layer of photoresist material 12, which has been applied in a liquid state, allowed to solidify, and photolithographically patterned by techniques well known to those skilled in the art. It is preferred to spin the substrate after application of the liquid photoresist at a speed dependent upon the viscosity of the resist, in order to achieve a relatively smooth, planar surface. As is also known, such photoresist may be either positive or negative, although a positive resist is preferred for sub-micron devices due to the better line width control presently available.

Figure 2:
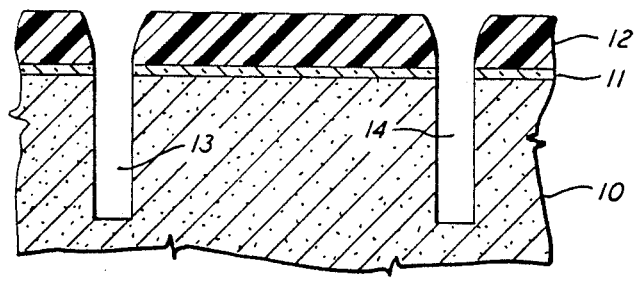
Figure 3:
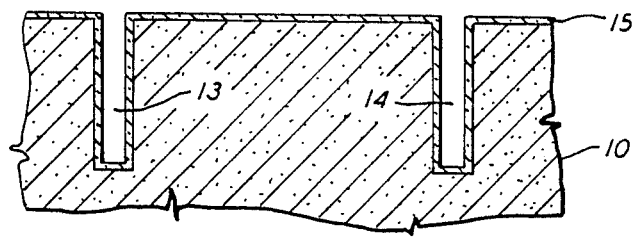

Referring now to FIG. 2, there are shown two isolation channels 13 and 14, which have been etched via the holes in layer 12 through the oxide layer 11 into the semiconductor body 10. Exemplary dimensions for such isolation channels are up to about 1 micron wide by about 6 to 8 microns deep. These channels are preferably formed by a dry etching technique such as plasma etching. Etching through the thermal oxide layer and the semiconductor body may be in a single continuous step or in two steps done sequentially. After etching of the isolation channels, the photoresist is stripped away, thermal oxide layer 11 is removed and a new thermal oxide layer 15 is formed which includes the walls and floor of the channels, as shown in FIG. 3, in order to keep the surface of the semiconductor relatively free of contaminants.

Other forms of isolation may be used, but the channels are preferred in that they generally enable the achievement of higher device density.

Figure 4:
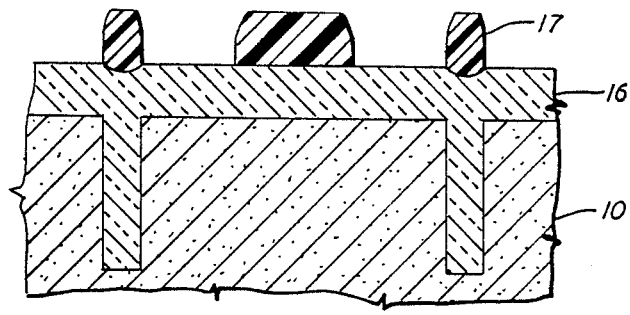
Figure 5:
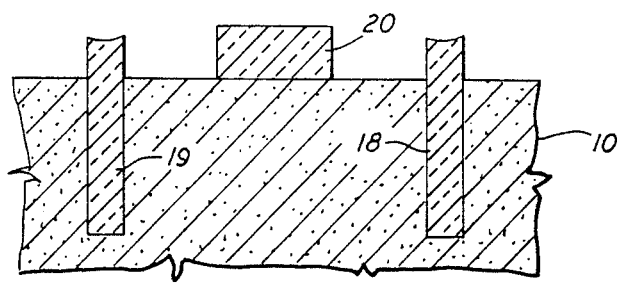

Next, as shown in FIG. 4, a relatively thick insulating layer 16 is formed on the surface of semiconductor body 10, for example, by the vapor deposition of silicon dioxide. This vapor deposited layer, often referred to as "glass", also fills the isolation channels. A photoresist layer is then applied to the surface of the deposited oxide layer 16 and patterned 17 to mask the isolation channels and the gate region of the device. The oxide layer is then etched, and the photoresist is stripped, leaving isolation channels 18 and 19 and gate trough-defining oxide mesa 20, as shown in FIG. 5.

Figure 6:
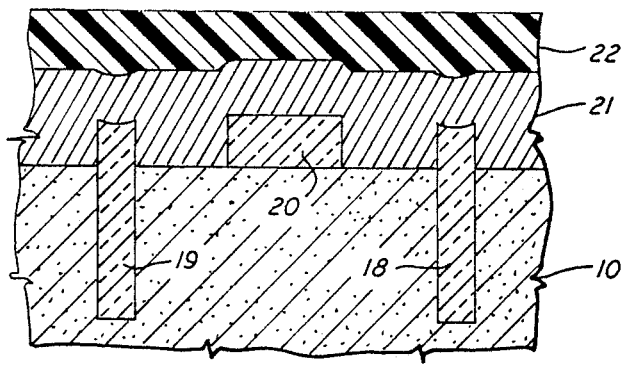
Figure 7:
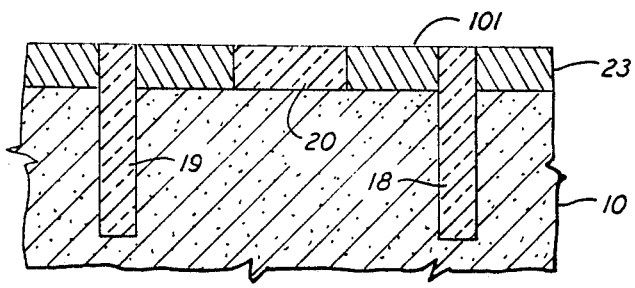

Next, a layer of undoped polysilicon 21 is deposited on the surface of the semiconductor body 10, covering the protruding portions of the isolation channels 18 and 19, as well as the gate trough-defining oxide mesa 20. As may be seen in FIG. 6, the upper surface of this polysilicon layer is uneven. The surface is then planarized by applying a layer of liquid photoresist 22 and spinning the resist to produce a planar surface. The photoresist layer 22 and a portion of the polysilicon layer 21 are then dry etched to achieve a planarized surface 101 in which polysilicon layer 23, gate trough-forming oxide mesa 20 and the isolation channel oxides 18 and 19 are all co-planar at their top surfaces, as shown in FIG. 7.

Figure 8:
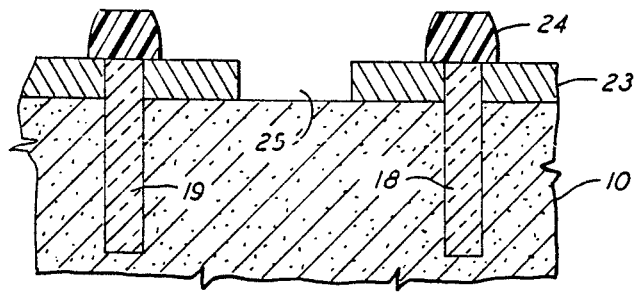
Figure 9:
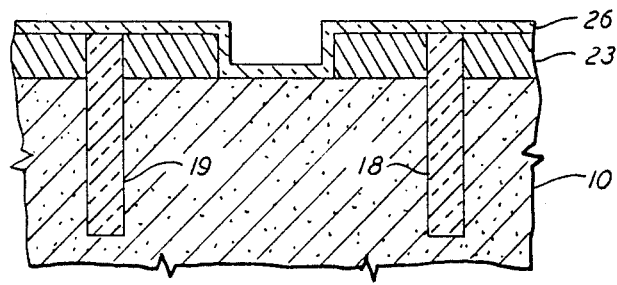

Next, the oxide mesa 20 is removed from the gate trough 25 by a wet chemical etch which is selective for oxides, during which the isolation channel oxides 18 and 19 are protected from removal by photoresist layer 24, as shown in FIG. 8. Following this, the photoresist layer is stripped away, and a new thin oxide layer 26 is thermally grown on the surface of the device as shown in FIG. 9. The portion of this layer 26 which covers the sides and bottom of the gate trough 25 will become the gate oxide for the device, to electrically isolate the gate from the laterally adjacent source and drain regions, and from the underlying substrate.

Figure 18:
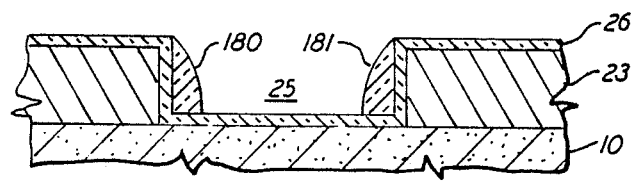
FIG. 18 is a detailed view of the trough of FIG. 9 including sidewall oxide spacers.

It will be recognized that the thickness of the gate oxide can be varied by techniques known in the art in order to vary the operating characteristics of the device. For example, rather than a thermally grown oxide layer, a relatively thick glass layer (e.g., about 2,000 to 3,000 Angstroms) may be formed in the gate trough, and then etched anisotropically to form oxide spacers 180 and 181 on the sides of the trough 25, as shown in FIG. 18. Alternatively, the thermal layer 26 may be grown under conditions which promote more rapid oxidation of the polysilicon sides than the single crystal silicon bottom of the trough.

This structure would be advantageous in providing additional isolation and thus reducing the Miller capacitance between the gate, source and drain regions of the device. Such reduced capacitance is advantageous, for example, in allowing reduced linewidths and consequently increased device density.

Figure 10:
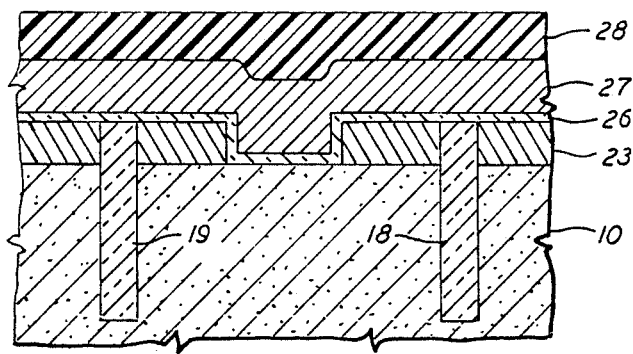
Figure 11:
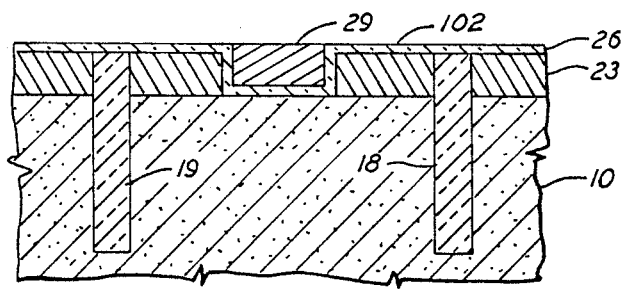

The next step is to deposit a layer 27 of gate material over the entire surface of the device, as shown in FIG. 10. Such a layer could be polysilicon, doped for example with phosphorus, to lower its electrical resistance. The uneven upper surface of layer 27 is planarized by spinning photoresist layer 28 onto layer 27, and then dry etching the layers until the only gate material remaining is confined to the gate trough 25, resulting in gate electrode 29 having a top surface co-planar with the remainder of the device surface 102, as shown in FIG. 11.

Figure 19:
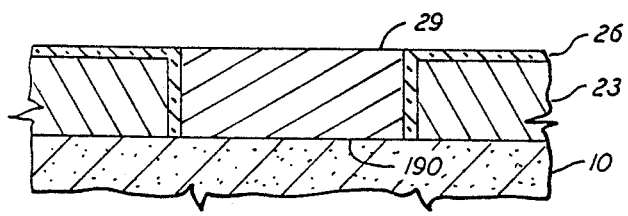
FIG. 19 is a detailed view of the filled trough of FIG. 11 with the oxide layer removed from the bottom of the trough.

It will be recognized that a bipolar device may be formed instead of an MOS device, by removing the thermal oxide layer 26 from the bottom of trough 25 prior to filling trough 25 with electrode material. FIG. 19 shows a bipolar structure in which electrode 29 is the emitter, and the surrounding polysilicon 23 is the base.

Figure 12:
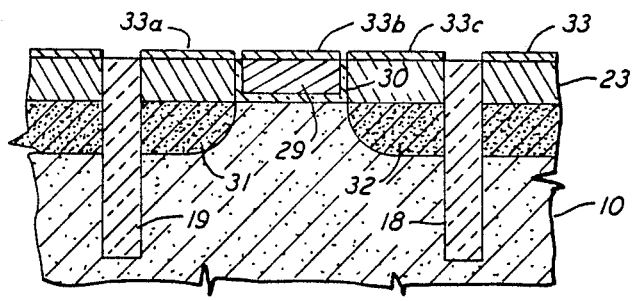

The next step in the formation of the device is the formation of the source and drain regions. As is known, this is done by introducing selected dopants into the semiconductor body 10 using the gate electrode 29 as a mask. As is also known, this may be done by ion implantation through the thin thermally grown oxide layer 26 or by thermal diffusion directly into polysilicon layer 23 after oxide layer 26 has been removed. The resulting source and drain regions 31 and 32 may extend somewhat below polysilicon layer 23 into the single crystal silicon substrate 10, as shown in FIG. 12.

Polysilicon is used for the gate and upper regions of the source and drain electrodes because it is physically and chemically compatible with the single crystal silicon substrate (from the standpoint of adhesion and intimate interfacial contact), and is capable of being doped to the point of becoming a conductor. In addition, the underlying silicon can be doped (31, 32) by causing dopants to diffuse from the polysilicon layer above into the substrate. Of course, other conductive materials such as refractory metals could also be used.

Following formation of the source and drain regions, if the thermally grown oxide layer 26 has not been previously removed for doping, it is removed from the upper surface of the device. It is then preferred to form separate layers 33a, 33b and 33c over the tops of the source 31, gate 29 and drain 32 regions, which layers have a higher electrical conductivity than the doped polysilicon layers 29 and 23. By way of example, a refractory metal such as tungsten or titanium can be deposited on the surface of the device, and then thermally treated to promote the formation of a tungsten or titanium silicide having a resistivity on the order of from about 1 to 20 ohms per square. This is primarily advantageous in allowing the polycrystalline layers to be thinner, thus reducing sidewall capacitance. Alternative refractory metals include cobalt, platinum, molybdenum, and tantalum.

Figure 13:
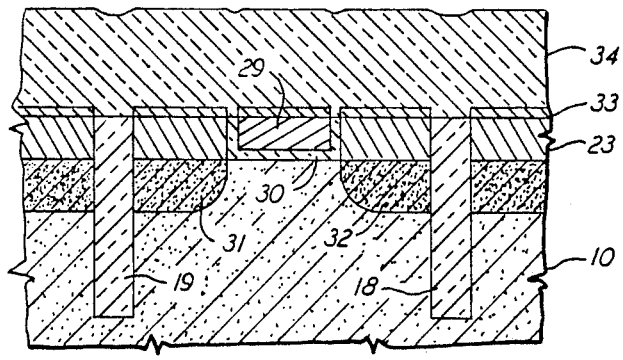
Figure 14:
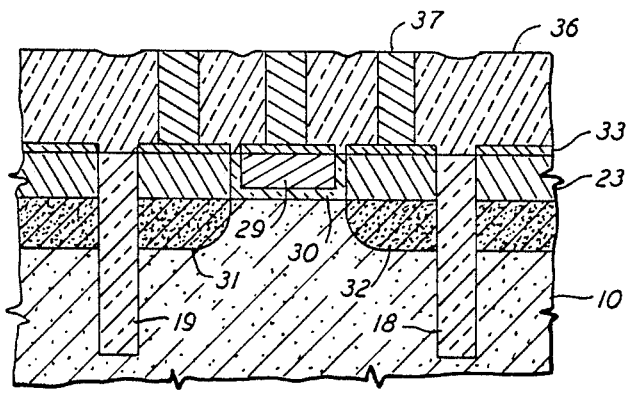
Figure 15:
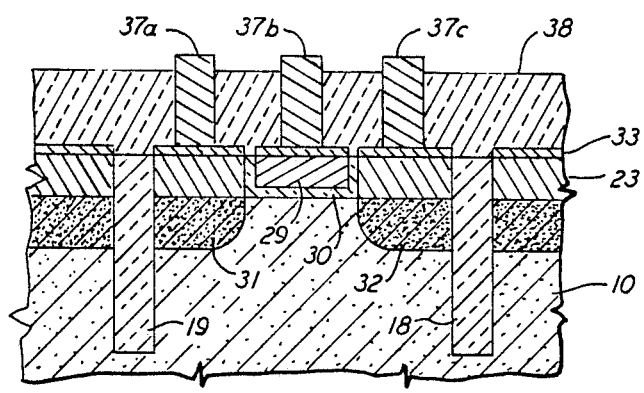

Next, the contacts for the source, drain and gate regions are formed by first forming a thick glass layer 34 over the entire surface of the device as shown in FIG. 13, and then etching contact holes 37 in glass layer 34 over the source 31, drain 32 and gate 29 areas as shown in FIG. 14. These holes 37 are filled with contact material such as doped polysilicon or a polysilicide such as tungsten silicide, produced for example by the low pressure chemical vapor deposition of tungsten, followed by thermal treatment to form the silicide. Glass layer 36 may then be selectively etched slightly, so that contacts 37a, 37b and 37c protrude above the etched surface 38, as shown in FIG. 15. Such etching may be done by dipping in a wet chemical etchant, as is known. The protrusions, referred to as "buttons", facilitate the making of good electrical contact to the subsequent metallization, and may aid in the alignment of subsequent layers.

Figure 16:
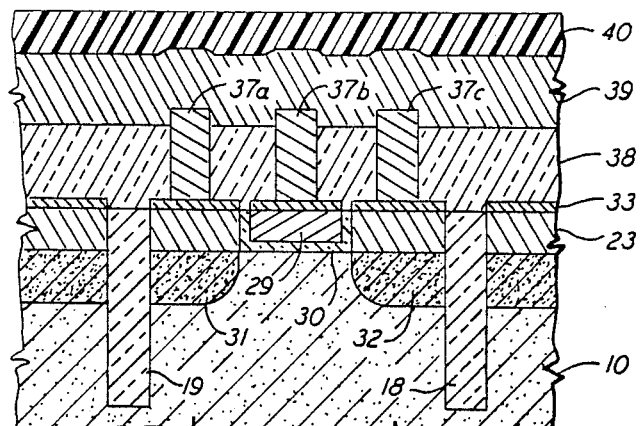
Figure 17:
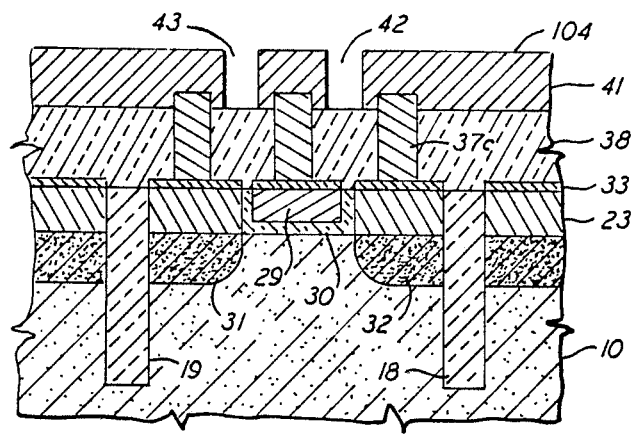

A metal layer, shown as layer 39 in FIG. 16, is then formed on the surface of the device. This is typically a sputtered or evaporated aluminum, or aluminum alloy layer. The upper surface of layer 39 may be planarized in the manner described above, by spinning photoresist layer 40 onto the top of layer 39 and then dry etching back to achieve layer 41 having a planarized surface, designated 104 in FIG. 17. The metal layer is then formed into the desired metallization pattern by wet or day etching to produce separations 42 and 43 as shown in FIG. 17.

The etching of the oxide layer 16 to leave mesa 20, as shown in FIGS. 4 and 5 above, is a key element of the process, in that the height of the mesa 20 determines the depth of the subsequently formed gate trough 25, as well as the thickness of the source, drain and subsequently applied gate electrode.

In integrated circuits having laterally adjacent semiconductor devices, the constant height of the source, drain and gate electrodes from one device to another enables the production of high density device circuits with a high degree of uniformity, and the planarity of these devices reduces to a minimum the possibility of defects due to discontinuities in the metallization.

As will be appreciated, it is also possible to interconnect one or more adjacent devices, for example, by etching away a portion of an isolation channel to allow continuity between adjacent polycrystalline silicon layers.

The oxide mesas which are used to form the gate troughs can also be configured in such a way that the later formation of the gate results in the interconnection of laterally adjacent devices as is known in connection with standard silicon gate processing. This could be significant in the fabrication of single function, multiple device circuits such as a static RAM memory cell.

In the final step of metallization, the upper surface is planarized as described in connection with FIG. 17. Of course, any number of additional planarized layers of devices or interconnections could be added, in a manner to preserve the overall planarity of the device.

What is claimed is:

1. A method for producing an MOS device comprising source, drain and gate electrodes in a body of semiconductor, material, the top surfaces of the source, drain and gate electrodes being coplanar, the method comprising the following steps:
   (a) selectively removing portions of a thick insulating layer on a single crystal semiconductor substrate to leave a mesa of insulating material on the substrate in a position corresponding to the desired gate region of the device;
(b) depositing a layer of source and drain material on the substrate and over the mesa to build up the surface of the semiconductor body and to define a gate trough therein;
(c) removing a portion of the source and drain layer in a manner to planarize the layer and to expose the insulating material filling the fate trough;
(d) removing the mesa-forming insulating material from the gate trough;
(e) forming a thin insulating layer at least on the walls and floor of the gate trough;
(f) forming the gate electrode in the gate trough;
(g) forming the source and drain electrodes; and
(h) providing electrical connection to the source, drain and gate electrodes by first forming contacts to each of these electrodes and then forming a metallization pattern thereon for external electrical connection to the source, drain and gate electrodes.

2. The method of claim 1 in which the source and drain material is a polycrystalline semiconductor.

3. The method of claim 2 in which the source and drain layer is planarized by:
(a) first depositing a layer of liquid photoresist on the surface of the polycrystalline layer to achieve a planar surface;
(b) allowing the photoresist to solidify; and
(c) etching the photoresist and the polycrystalline semiconductor material at approximately the same rate to remove the photoresist and portions of the polycrystalline layer.

4. The method of claim 1 in which the gate electrode is formed by:
(a) forming the thin insulating layer over the entire exposed surface of the semiconductor body;
(b) depositing a layer of gate material on this thin insulating layer;
(c) depositing a liquid photoresist layer on the layer of gate material to planarize the surface thereof;
(d) allowing the photoresist to solidify;
(e) etching the photoresist and gate material at approximately the same rate to remove the photoresist and the portion of the gate material above the top of the gate trough.

5. The method of claim 4 in which the source and drain electrodes are formed by removing the thin insulating layer from over the positions corresponding to the desired source and drain regions, and thermally diffusing dopants into the semiconductor body.

6. The method of claim 4 in which the source and drain electrodes are formed by implanting dopants through the thin insulating layer into the semiconductor body.

7. The method of claim 1 in which the electrical connection to the source, drain and gate electrodes is formed by:
(a) forming a thick insulating layer over the entire surface of the semiconductor device;
(b) selectively removing portions of the insulating layer to form holes in the layer over the source, drain and gate electrodes;
(c) filling the holes with electrical contact material; and
(d) forming a planarized metallization pattern over the top of and in electrical contact with the contact material in the holes.

8. The method of claim 7 in which a portion of the insulating layer is removed to allow the contacts filling the holes to protrude above the insulating layer surface to form contact buttons prior to metallization.

9. The method of claim 1 in which prior to forming the thick insulating layer corresponding to the subsequent oxide mesa and gate trough, at least one electrical isolation channel is formed to isolate the device from laterally adjacent devices in the semiconductor body.

10. The method of claim 9 in which the isolation channel is formed by selectively etching a deep channel through a thin surface insulating layer into the semiconductor body, so that the subsequent formation of the thick insulating layer fills the isolation channel with insulating material.

11. The method of claim 10 in which following filling of the isolation channel with insulating material and prior to depositing the polycrystalline layer for the source and drain regions, at least a portion of the insulating material above the channel is removed so that upon formation of the polycrystallinelayer, continuity is provided in the layer above the channel, resulting in interconnection between adjacent devices on the substrate.

12. The method of claim 1 in which after the gate trough has been filled with gate material, the thin insulating layer on the surface of the semiconductor body is removed and replaced by separate layers of material over the source, drain and gate electrodes having higher electrical conductivity than the source, drain and gate materials.

13. The method of claim 12 in which the semiconductor material is silicon, the gate material consists of doped polycrystalline silicon, and the separate layers of higher conductivity comprises refractory metal silicides.

14. The method of claim 13 in which the silicide layers are formed by first forming refractory metal layers, and then heating to promote the thermal formation of silicides by reaction of the refractory metal layer with the underlying polycrystalline silicon layer.

15. A method for producing a planar semiconductor device in a body of semiconductor material, the method comprising the following steps:
(a) selectively removing portions of a thick insulating layer on a single crystal semicondcutor substrate to leave a mesa of insulating material on the substrate in a position corresponding to a desired electrode region of the device;
(b) depositing a layer of polycrystalline semiconductor material on the substrate and over the mesa to build up the surface of the semiconductor body and to define a trough therein;
(c) removing a portion of the polycrystalline layer in a manner to planarize the layer and to expose the insulating material filling the trough;
(d) removing the mesa-forming insulating material from the trough;
(e) forming an insulating layer on the walls and floor of the trough;
(f) forming an electrode in the trough;
(g) forming at least one additional electrode in the surrounding semiconductor body; and
(h) providing external electrical connection to the electrodes.

16. The method of claim 15 in which the portion of the insulating layer formed on the floor of the trough is removed prior to filling the trough with electrode material, whereby upon completion of the device, the trough electrode is the emtter and the additional electrode is the base of a bipolar device.

* * * * *